United States Patent
Wu

(10) Patent No.: US 11,139,814 B2
(45) Date of Patent: Oct. 5, 2021

(54) POWER SWITCH CIRCUIT

(71) Applicant: uPI semiconductor corp., Zhubei (TW)

(72) Inventor: Chia-Lung Wu, Zhubei (TW)

(73) Assignee: UPI SEMICONDUCTOR CORP., Zhubei (TW)

( * ) Notice: Subject to any disclaimer, the term of this patent is extended or adjusted under 35 U.S.C. 154(b) by 0 days.

(21) Appl. No.: 17/158,069

(22) Filed: Jan. 26, 2021

(65) Prior Publication Data

US 2021/0258007 A1 Aug. 19, 2021

(30) Foreign Application Priority Data

Feb. 18, 2020 (TW) .................................. 109201767

(51) Int. Cl.
| H03K 17/00 | (2006.01) |
| H03K 17/06 | (2006.01) |
| H03K 17/18 | (2006.01) |
| G05F 1/10 | (2006.01) |
| G05F 1/575 | (2006.01) |
| H03K 17/687 | (2006.01) |

(52) U.S. Cl.
CPC .................................. H03K 17/687 (2013.01)

(58) Field of Classification Search
None
See application file for complete search history.

(56) References Cited

U.S. PATENT DOCUMENTS

| 6,118,321 A * | 9/2000 | Rees ................... H03K 17/0822 327/309 |
| 6,353,309 B1 * | 3/2002 | Ootani ................. H03K 17/122 323/282 |
| 6,947,272 B2 * | 9/2005 | Daniels .............. H03K 17/0822 361/93.7 |
| 7,466,573 B2 * | 12/2008 | Kojori ................ H03K 17/6872 363/65 |
| 8,497,714 B2 | 7/2013 | Garbossa et al. |
| 10,177,576 B2 | 1/2019 | Huang et al. |
| 10,312,898 B2 * | 6/2019 | Moctezuma ........... H02H 3/087 |
| 10,312,899 B2 | 6/2019 | Roy et al. |
| 10,381,822 B2 * | 8/2019 | Jia ............................ H02H 3/28 |
| 2006/0044709 A1 * | 3/2006 | Seiersen ................. H02J 1/001 361/18 |

FOREIGN PATENT DOCUMENTS

CN 101373965 A 2/2009

* cited by examiner

*Primary Examiner* — Kenneth B Wells
(74) *Attorney, Agent, or Firm* — McClure, Qualey & Rodack, LLP

(57) ABSTRACT

A power switch circuit is disclosed. The power switch circuit includes an input terminal, an output terminal, a power switch, a control circuit and a voltage holding circuit. The power switch is coupled between the input terminal and the output terminal. The power switch has a control terminal. The control circuit is coupled to the input terminal and the output terminal respectively. The control circuit compares a first voltage of the input terminal with a second voltage of the output terminal to generate a control signal. The voltage holding circuit is coupled to the control circuit and the control terminal. The voltage holding circuit provides a default voltage larger than 0 V to the control terminal according to the control signal.

8 Claims, 3 Drawing Sheets

POWER SWITCH CIRCUIT

BACKGROUND OF THE INVENTION

1. Field of the Invention

The invention relates to power switch; in particular, to a power switch circuit.

2. Description of the Prior Art

Please refer to FIG. 1, an electronic device (e.g., a cellular phone, a game console handle, etc.) 1 includes an internal power source (e.g., a battery) 10, a power switch circuit 12, a load circuit 14 and a power connector (e.g., a universal serial bus (UBS) interface) 16.

In general, in addition to be powered by its internal power source 10, the electronic device 1 can also be powered by an external power source (e.g., a charger, a computer host, etc.) 2 through the power connector 16. For example, the internal power source 10 can provide an input voltage VIN (e.g., 5 volts) and provide an output voltage VOUT to the load circuit 14 through the power switch circuit 12, or the electronic device 1 can receive a voltage (e.g., 5 volts, even high voltage power source of 12 volts or 24 volts under the specification of USB Type-C) from the external power source 2 through the power connector 16.

As shown in FIG. 2, before the time t1, the electronic device 1 is not coupled to the external power source 2, and its internal power source 10 stably provides the output voltage VOUT and the output current IOUT to the load circuit 14. At the time t1, the electronic device 1 is coupled to the external power source 2 (its voltage is higher than or equal to the voltage of the internal power source 10) through the power connector 16, so that the output voltage VOUT starts to increase and the output current IOUT provided by the internal power source 10 decreases, and the output current IOUT may be affected by the external power source 2 to be lower than 0A (that is, the negative current flowing back from the external power source 2). At the time t2, the output voltage VOUT reaches a first default value (a trip point) P1 (e.g., the voltage supplied by the external power source 2), the power switch circuit 12 will turn off the power switch by decreasing a control voltage VG of the power switch to 0V. At this time, the output current IOUT is 0A and the output voltage VOUT is the voltage value P1 supplied by the external power source 2. During the period from the time t2 to the time t3, the control voltage VG of the power switch is maintained at 0V, and the electronic device 1 is powered by the external power source 2. At the time t3, the external power source 2 is unloaded and no longer supplies power. At this time, the load circuit 14 continues consuming the charges stored in the output capacitor to make the output voltage VOUT start to decrease. At the time t4, the output voltage VOUT drops to a second default value (a release point) P2 (e.g., the value of the input voltage VIN). At this time, the power switch circuit 12 will start to increase the control voltage VG of the power switch to turn on the power switch.

However, since the conventional power switch circuit 12 provides the control voltage VG of the power switch through a single charge pump only, the increasing rate of the control voltage VG of the power switch from 0V from the time t4 is too slow, and it does not reach the threshold voltage (VOUT+Vth) (approximately 8V) that the power switch is turned on until the time t5, so that during the period from the time t4 to the time t5, when the control voltage VG of the power switch has not yet climbed from 0V to 8V (that is, when the power switch is not turned on), the output voltage VOUT has decreased below the safe value VSF (e.g., 4.75 volts), causing the system to automatically shut down, which seriously affects the normal operation of the electronic device. This shortcoming needs to be urgently improved.

SUMMARY OF THE INVENTION

Therefore, the invention provides a power switch circuit to effectively solve the above-mentioned problems in the prior art.

An embodiment of the invention is a power switch circuit. In this embodiment, the power switch circuit includes an input terminal, an output terminal, a power switch, a control circuit and a voltage holding circuit. The power switch is coupled between the input terminal and the output terminal. The power switch has a control terminal. The control circuit is coupled to the input terminal and the output terminal respectively. The control circuit compares a first voltage of the input terminal with a second voltage of the output terminal to generate a control signal. The voltage holding circuit is coupled to the control circuit and the control terminal. The voltage holding circuit provides a default voltage larger than 0 V to the control terminal according to the control signal.

In an embodiment of the invention, the voltage holding circuit includes a clamping circuit configured to provide the default voltage according to the control signal.

In an embodiment of the invention, the clamping circuit includes a switch coupled to the control terminal and received, the operation of the switch is controlled by the control signal to provide the default voltage to the control terminal.

In an embodiment of the invention, the voltage holding circuit includes a current path circuit, and the current path circuit includes a first path and a second path coupled in parallel between the control terminal and a ground terminal; the first path includes a first switch and a resistor coupled in series and the second path includes a pulse generation circuit and a second switch.

In an embodiment of the invention, when the second voltage is higher than the first voltage, the first path is turned on.

In an embodiment of the invention, when the second voltage is changed from being lower than the first voltage to be higher than the first voltage, the second path is turned on for a first default time and then turned off.

In an embodiment of the invention, the voltage holding circuit includes a current source circuit coupled to the control circuit and the control terminal respectively, when the second voltage is changed from being higher than the first voltage to be lower than the first voltage, the current source circuit provides a second current for a second default time and then provides a first current, wherein the second current is greater than the first current.

In an embodiment of the invention, the voltage holding circuit includes a current source circuit coupled to the control circuit and the control terminal respectively, the current source circuit includes a first current source and a second current source configured to provide a first current and a third current respectively, wherein the third current is greater than the first current.

In an embodiment of the invention, when the second voltage is changed from being higher than the first voltage to be lower than the first voltage, the second current source provides the third current for a second default time and then stops providing.

Compared to the prior art, the electronic device and its power switch circuit of the invention can not only effectively increase the response speed when the power source is switched to avoid the automatic shutdown of the system when the external power source is plugged, but also effectively prevent the external high-voltage power source coupled to the electronic device from damaging the electronic device. Therefore, the electronic device can be stably powered to maintain the normal operation of the electronic device.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

Figure 1:
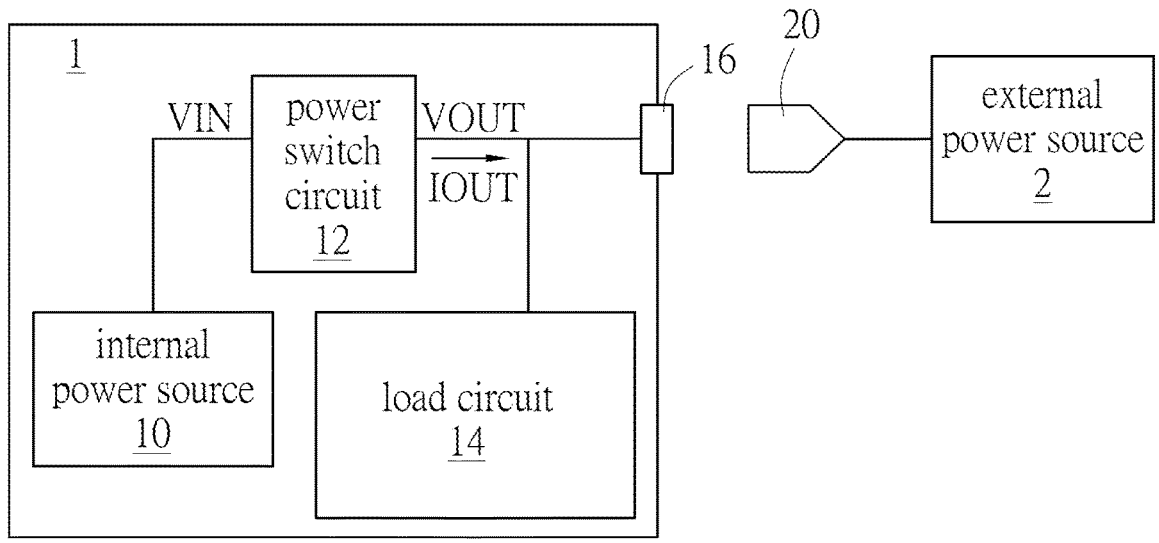
FIG. 1 illustrates a system schematic diagram of the electronic device.
Figure 2:
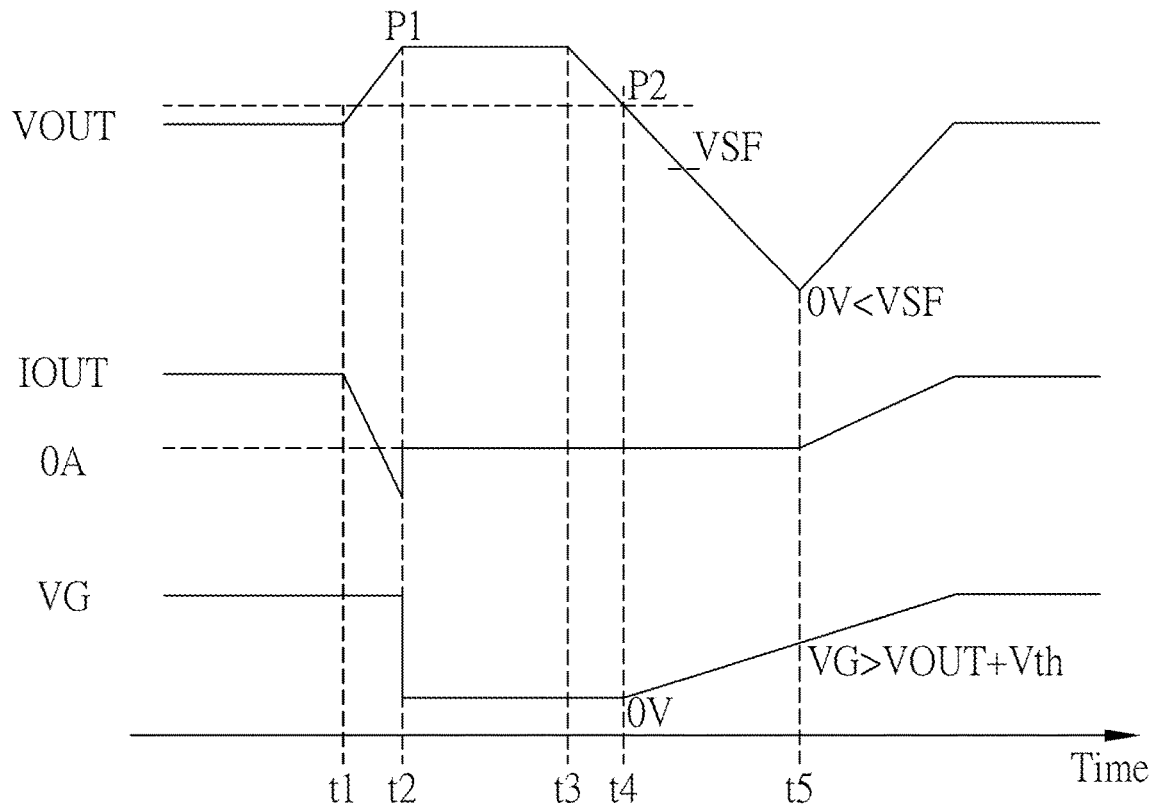
FIG. 2 illustrates a timing diagram of the electronic device loading and unloading the external power source in the prior art.

Exemplary embodiments of the invention are referenced in detail now, and examples of the exemplary embodiments are illustrated in the drawings. Further, the same or similar reference numerals of the components/components in the drawings and the detailed description of the invention are used on behalf of the same or similar parts.

An embodiment of the invention is an electronic device. As shown in FIG. 1, the electronic device 1 includes an internal power source 10, a power switch circuit 12, a load circuit 14 and a power connector 16. The internal power source 10 is coupled to the power switch circuit 12; the power switch circuit 12 is coupled to the load circuit 14 and the power connector 16; the load circuit 14 is coupled to the power switch circuit 12 and the power connector 16.

The internal power source 10 provides an input voltage VIN (i.e., a first voltage) to the power switch circuit 12 and provides an output voltage VOUT (i.e., a second voltage) and an output current (IOUT) to the load circuit 14 through the power switch circuit 12. When a connector 20 of the external power source 2 is coupled to the power connector 16 of the electronic device 1, the electronic device 1 can receive power from the external power source 2 through the power connector 16 and cut off a power supply path from the internal power source 10 to the load circuit 14 through the power switch circuit 12.

In practical applications, the electronic device 1 can be, for example, a cellular phone or a game console handle, etc., but not limited to this; the internal power source 10 can be, for example, a battery or a power converter, etc., but not limited to this; the power connector 16 can be, for example, a universal serial bus (USB) interface, etc., but not limited to this; the external power source 2 can be, for example, a charger or a computer host, etc., but not limited to this.

It should be noted that the input voltage VIN (i.e., the first voltage) provided by the internal power source 10 can be 5 volts, but not limited to this; the voltage provided by the external power source 2 can also be 5 volts or higher (e.g., 12 volts, 24 volts, etc.) under the specification of USB Type-C, but not limited to this.

Next, the power switch circuit of the electronic device will be described in detail.

Figure 3:
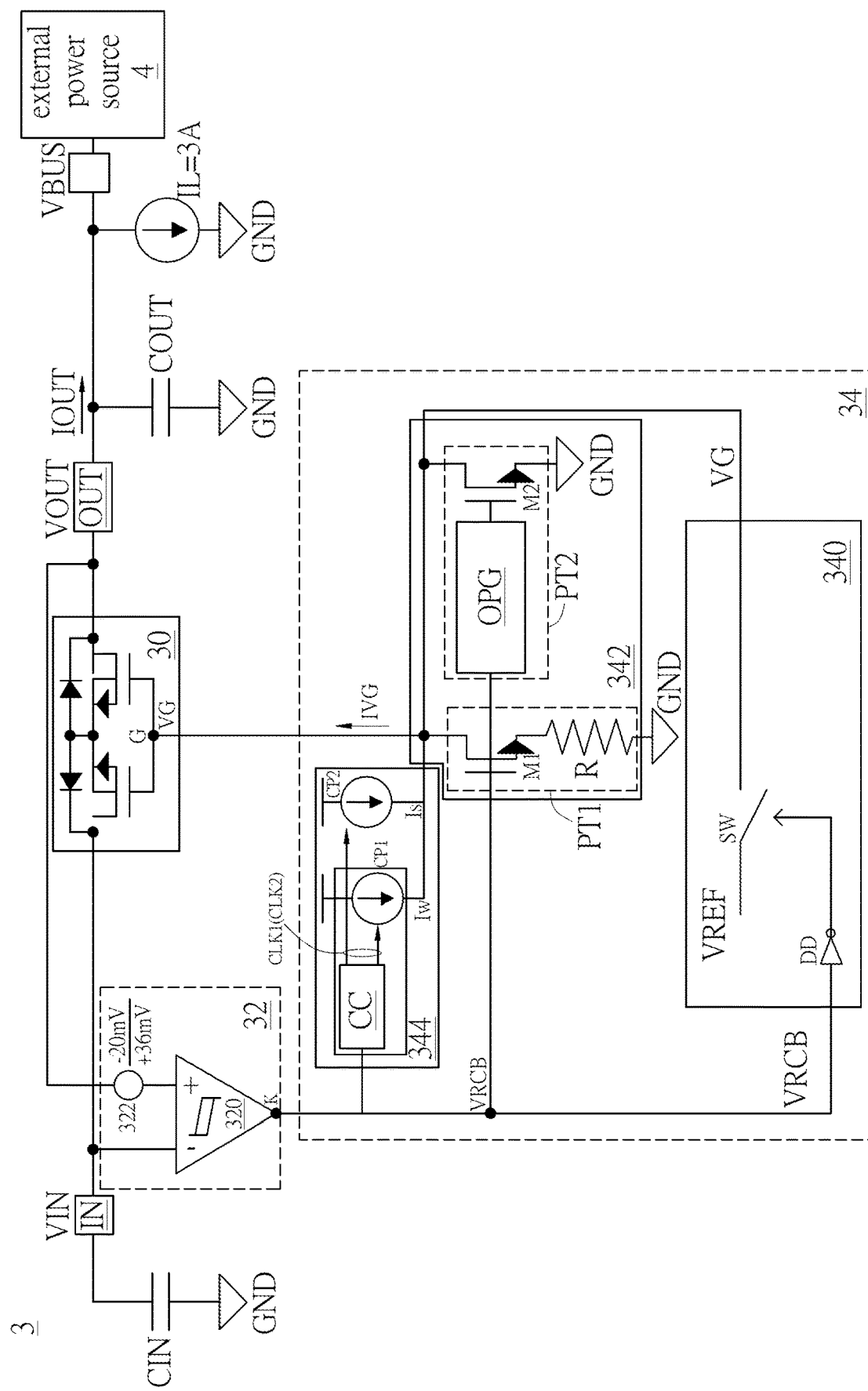
FIG. 3 illustrates a schematic diagram of the power switch circuit in a preferred embodiment of the invention.

Please refer to FIG. 3, which illustrates a schematic diagram of the power switch circuit in a preferred embodiment of the invention.

As shown in FIG. 3, the power switch circuit 3 includes an input terminal IN, an output terminal OUT, a power switch 30, a control circuit 32 and a voltage holding circuit 34. The input terminal IN is coupled to a ground terminal GND through an input capacitor CIN. The power switch 30 is coupled between the input terminal IN and the output terminal OUT. The output terminal OUT is coupled to the ground terminal GND through an output capacitor COUT. The output terminal OUT is coupled to the external power source 4 through a power connector VBUS. The control circuit 32 is coupled between the input terminal IN and the power switch 30, between the power switch 30 and the output terminal OUT, and the voltage holding circuit 34 respectively. The voltage holding circuit 34 is coupled to the control circuit 32 and the power switch 30 respectively.

The power switch 30 can be a switch element with bidirectional protection (i.e., a bidirectional protection element) to prevent the current from flowing back to the input terminal IN when the output voltage VOUT (i.e., the second voltage) is higher than the input voltage VIN (i.e., the first voltage). Two terminals of the power switch 30 are coupled to the input terminal IN and the output terminal OUT respectively and the control terminal G of the power switch 30 is coupled to the voltage holding circuit 34. The input terminal IN has the input voltage VIN and the output terminal OUT has the output voltage VOUT.

In an embodiment, the control circuit 32 includes a comparator 320. The comparator 320 has a positive input terminal +, a negative input terminal − and an output terminal K. In practical applications, the control circuit 32 further includes a bias voltage source 322 coupled between the output terminal OUT and the positive input terminal + of the comparator 320 to determine the second voltage value P2 controlling the power switch 30 to turn on. The negative input terminal − of the comparator 320 is coupled to the input terminal IN. The output terminal K of the comparator 320 is coupled to the voltage holding circuit 34.

When the comparator 320 receives the input voltage VIN (that is, the first voltage) and the output voltage VOUT (that is, the second voltage) through its negative input terminal − and positive input terminal + respectively, the comparator 320 will compare the input voltage VIN (i.e., the first voltage) and the output voltage VOUT (i.e., the second voltage) to generate a control signal VRCB, and the control signal VRCB is output to the voltage holding circuit 34 through the output terminal K. In practical applications, in order to prevent the control circuit 32 from malfunctioning, the comparator 320 can have an input offset window, but is not limited to this.

The voltage holding circuit 34 can include a clamping circuit 340, a current path circuit 342 and a current source circuit 344. The clamping circuit 340, the current path circuit 342 and the current source circuit 344 are coupled to the output terminal K of the comparator 320 and the control terminal G of the power switch 30 respectively to maintain the control voltage VG of the control terminal G at a value greater than 0 volts when the power switch 30 is turned off.

In an embodiment, the clamping circuit 340 includes a switch SW. One terminal of the switch SW receives the default voltage VREF and the other terminal of the switch SW is coupled to the control terminal G of the power switch 30. When the clamping circuit 340 receives the control signal VRCB, the switch SW is turned on according to the control signal VRCB to provide the default voltage VREF to the control terminal G of the power switch 30, so that the control voltage VG of the control terminal G is equal to the default voltage VREF, and the default voltage VREF is greater than 0 volts and lower than the turn-on voltage of the power switch 30.

In an embodiment, the current path circuit 342 includes a first path PT1 and a second path PT2. The first path PT1 and the second path PT2 are coupled in parallel between the control terminal G of the power switch 30 and the ground terminal GND and the first path PT1 and the second path PT2 are both coupled to the output terminal K of the comparator 320 and both controlled by the control signal VRCB.

The first path PT1 includes a first switch M1 and a resistor R. The first switch M1 and the resistor R are coupled in series between the control terminal G of the power switch 30 and the ground terminal GND. The control terminal of the first switch M1 is coupled to the output terminal K of the comparator 320 and controlled by the control signal VRCB.

The second path PT2 includes a pulse generation circuit OPG and a second switch M2. The pulse generation circuit OPG is coupled between the output terminal K of the comparator 320 and the control terminal of the second switch M2. The second switch M2 is coupled between the control terminal G of the power switch 30 and the ground terminal GND and the control terminal of the second switch M2 is coupled to the pulse generation circuit OPG. The pulse generation circuit OPG generates a pulse signal to the control terminal of the second switch M2 according to the control signal VRCB.

When the power switch 30 needs to be turned off, the control signal VRCB transits to trigger the pulse generation circuit OPG to generate a one-time pulse, so that the second switch M2 is briefly turned on for a first default time (e.g., 2 us, but not limited to this) and then turned off to quickly pull the control voltage VG to the ground voltage. At the same time, the first switch M1 is continuously turned on according to the control signal VRCB, and the control voltage of the control terminal G of the power switch 30 is raised to a value greater than 0 volts through the resistor R.

In practical applications, the first switch M1 can be a low-voltage metal-oxide-semiconductor field-effect transistor (LVMOS) and the second switch M2 can be a high-voltage metal-oxide-semiconductor field-effect transistor (HVMOS), and the pulse generation circuit OPG can be a single pulse generator, but not limited to this.

In an embodiment, the current source circuit 344 of the voltage holding circuit 34 is coupled to the control circuit 32 and the control terminal G of the power switch 30 respectively. When the output voltage VOUT (i.e., the second voltage) changes from being higher than the input voltage VIN (i.e., the first voltage) to be lower than the input voltage VIN, the current source circuit 344 provides the control current IVG (i.e., the second current) for a default time (i.e., the second default time, such as 5 us, but not limited to this) and then provides the first current Iw instead, wherein the control current IVG is greater than the first current Iw.

In an embodiment, the current source circuit 344 can include a clock circuit CC, a first current source CP1 and a second current source CP2. The first current source CP1 and the second current source CP2 can be current pumps, but not limited to this. The clock circuit CC is coupled to the output terminal K of the comparator 320, the first current source CP1 and the second current source CP2 respectively. Both the first current source CP1 and the second current source CP2 are coupled to the control terminal G of the power switch 30 through the current path circuit 342. The first current source CP1 and the second current source CP2 provide a first current Iw and a third current Is respectively, and the third current Is is greater than the first current Iw. The sum of the first current Iw and the third current Is is the control current IVG (i.e., the second current IVG).

When a comparison result obtained by the comparator 320 is that the output voltage VOUT (i.e., the second voltage) is higher than the input voltage VIN (i.e., the first voltage), the control signal VRCB outputted by the output terminal K of the comparator 320 will have a second level (e.g., high-level).

When the input voltage VIN (i.e., the first voltage) is changed from being lower than the output voltage VOUT (i.e., the second voltage) to be higher than the output voltage VOUT, a voltage level of the control signal VRCB is changed from the second level (e.g., high-level) to a first level (e.g., low-level), the clock circuit CC will provide the first clock signal CLK1 to the first current source CP1 and the second current source CP2 for a default time (i.e., the second default time, such as 5 us, but not limited to this), and then the clock circuit CC will provide the second clock signal CLK2 to the first current source CP1 instead, and the frequency of the first clock signal CLK1 will be greater than the frequency of the second clock signal CLK2.

In order to reduce the energy consumption of the components, the clock circuit CC stops providing the clock signal to the second current source CP2 at the same time when the clock circuit CC is changed to provide the second clock signal CLK2 to the first current source CP1 instead.

In other words, when the external power source 4 is coupled to turn off the power switch 30, the voltage holding circuit 34 maintains the control voltage VG of the control terminal G at the default voltage VREF (e.g., 4.3 volts). When the external power source 4 is unloaded and no longer supplies power, the charges stored in the output capacitor COUT will be consumed by the load circuit 14, so that the output voltage VOUT starts to drop. When the output voltage VOUT drops from being higher than the input voltage VIN to be equal to the input voltage VIN, the power switch circuit 3 starts to quickly provide a large amount of current through the current source circuit 344 to raise the control voltage VG of the control terminal G, so that the control voltage VG is increased from the default voltage VREF (e.g., 4.3 volts) to the threshold voltage (e.g., 8 volts) at which the power switch 30 is turned on, so as to maintain the output voltage VOUT above a safe value (e.g., 4.75 volts) to ensure the normal operation of the system.

Figure 4:
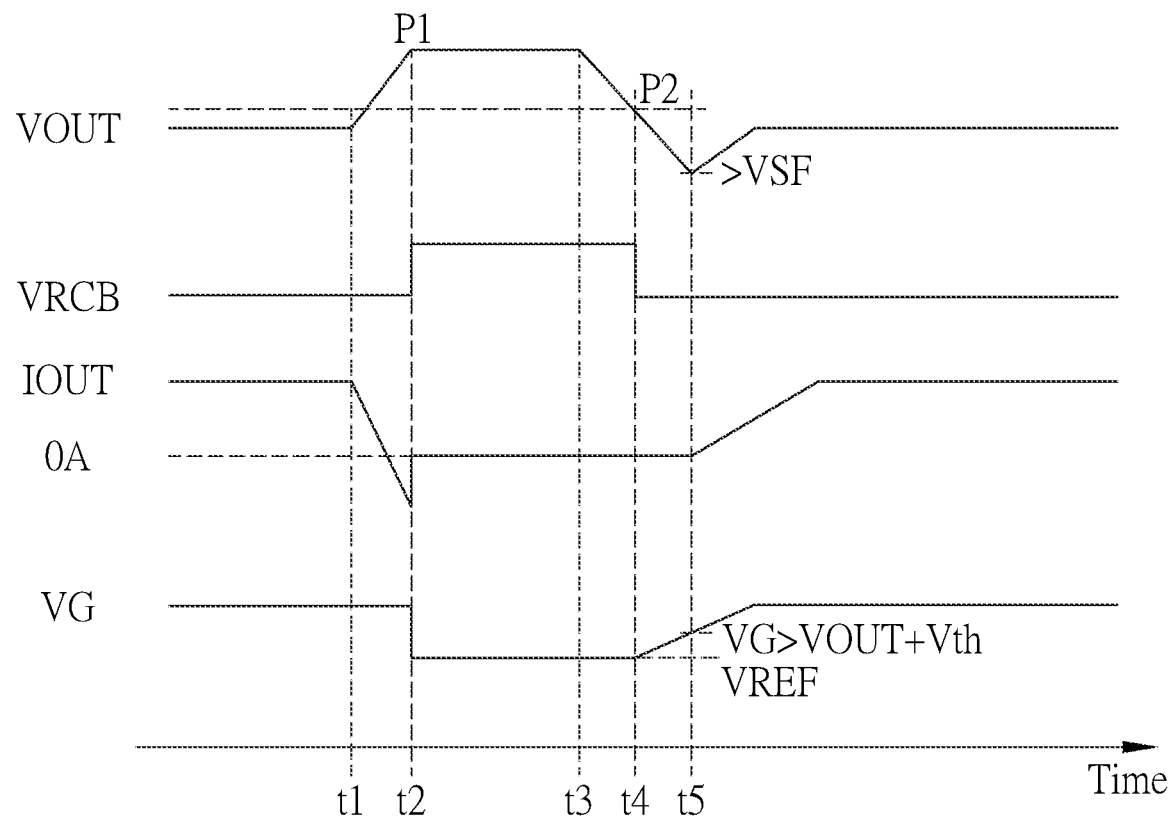
FIG. 4 illustrates a timing diagram according to the embodiment of FIG. 3.

Please refer to FIG. 4. Before the time t1, the power connector VBUS is not coupled to the external power source 4, but the internal power source stably provides the output voltage VOUT and the output current IOUT; at the time t1, the power connector VBUS is coupled to the external power source 4 (its voltage is higher than or equal to the voltage of the internal power source), causing the output voltage VOUT to climb and the output current IOUT provided by the internal power source to decrease, and the output current IOUT may be affected by the external power source 4 to be lower than 0A (that is, the negative current flowing back from the external power source 4).

At the time t2, the output voltage VOUT reaches a first default value (a trip point) P1. At this time, the power switch 30 is turned off and its control terminal G will receive a default voltage VREF (e.g., 4.3 volts, but not limited to this) that is greater than 0 volts provided by the clamping circuit 340, so that the control voltage VG of the control terminal G is equal to the default voltage VREF greater than 0 volts.

By doing so, in the subsequent process, the current source circuit 344 only needs to raise the control voltage VG of the control terminal G from the default voltage VREF (e.g., 4.3 volts) to the threshold voltage (VOUT+Vth) (e.g., 8 volts) at which the power switch 30 is turned on instead of raising from 0 volts to 8 volts as in the prior art, so that the voltage difference required to raise the control voltage VG can be effectively reduced, thereby increasing the speed at which the current source circuit 344 raises the control voltage VG.

Then, during the period from the time t2 to the time t3, it is powered by the external power source 4, and the control voltage VG of the control terminal G will be maintained at the default voltage VREF; at the time t3, the external power source 4 is unloaded and no longer supplies power. At this time, the charges stored in the output capacitor COUT will be consumed by the load circuit 14 to cause the output voltage VOUT to begin to drop; at the time t4, the output voltage VOUT drops to a second default value (a release point) P2 (e.g., equal to the input voltage VIN=5 volts). At this time, the current path circuit 342 will be turned off, and the first current source CP1 and the second current source CP2 in the current source circuit 344 will start to provide the first current Iw and the third current Is respectively, wherein the third current Is is greater than the first current Iw. And, the sum of the first current Iw and the third current Is becomes the control current IVG (i.e., the second current IVG), which is then outputted to the control terminal G to accelerate the raising of the control voltage VG of the control terminal G. At the time t5, the control voltage VG has been quickly raised to the threshold voltage (VOUT+Vth) at which the power switch 30 is turned on, so that the power switch 30 is turned on.

In other words, when the output voltage VOUT (the second voltage) is changed from being higher than the input voltage VIN (the first voltage) to be lower than the input voltage VIN (the first voltage), the current source circuit 344 will provide a larger control current IVG (the second current) for a period of default time (the time t4 to the time t5) and then provide a smaller first current Iw instead.

In addition, in another embodiment, when the output voltage VOUT (the second voltage) is changed from being higher than the input voltage VIN (the first voltage) to be lower than the input voltage VIN (the first voltage), the current source circuit 344 can only provide the third current Is from the second current source CP2 for the period of default time (the time t4 to the time t5) and then stop providing. The third current Is provided by the second current source CP2 is greater than the first current Iw provided by the first current source CP1.

It should be noted that although the output voltage VOUT drops at this time, it is still greater than the safe value VSF (e.g., 4.75 volts), so that the system including the load circuit 14 will not automatically shut down, but can maintain its normal operation.

Compared to the prior art, the electronic device and its power switch circuit of the invention can not only effectively increase the response speed when the power source is switched to avoid the automatic shutdown of the system when the external power source is plugged, but also effectively prevent the external high-voltage power source coupled to the electronic device from damaging the electronic device. Therefore, the electronic device can be stably powered to maintain the normal operation of the electronic device.

What is claimed is:

1. A power switch circuit, comprising:
an input terminal, having a first voltage;
an output terminal, having a second voltage;
a power switch, coupled between the input terminal and the output terminal, having a control terminal;
a control circuit, coupled to the input terminal and the output terminal respectively and configured to compare the first voltage with the second voltage to generate a control signal; and
a voltage maintaining circuit, coupled to the control circuit and the control terminal and comprising a clamping circuit configured to provide a default voltage to the control terminal according to the control signal, wherein the default voltage is larger than 0 volts.

2. The power switch circuit of claim 1, wherein the clamping circuit comprises a switch coupled to the control terminal and to receive the default voltage, the operation of the switch is controlled by the control signal to provide the default voltage to the control terminal.

3. The power switch circuit of claim 1, wherein the voltage maintaining circuit comprises a current path circuit, and the current path circuit comprises a first path and a second path coupled in parallel between the control terminal and a ground terminal; the first path comprises a first switch and a resistor coupled in series and the second path comprises a pulse generation circuit and a second switch.

4. The power switch circuit of claim 3, wherein when the second voltage is higher than the first voltage, the first path is turned on.

5. The power switch circuit of claim 3, wherein when the second voltage is changed from being lower than the first voltage to be higher than the first voltage, the second path is turned on for a first default time and then turned off.

6. The power switch circuit of claim 1, wherein the voltage maintaining circuit comprises a current source circuit coupled to the control circuit and the control terminal, respectively, when the second voltage is changed from being higher than the first voltage to be lower than the first voltage, the current source circuit provides a second current for a default time and then provides a first current, wherein the second current is greater than the first current.

7. The power switch circuit of claim 1, wherein the voltage maintaining circuit comprises a current source circuit coupled to the control circuit and the control terminal, respectively, the current source circuit comprises a first current source and a second current source configured to provide a first current and a second current, respectively, wherein the second current is greater than the first current.

8. The power switch circuit of claim 7, wherein when the second voltage is changed from being higher than the first voltage to be lower than the first voltage, the second current source provides the second current for a default time and then stops providing.

* * * * *